United States Patent
Marquis et al.

(10) Patent No.: US 9,769,576 B2
(45) Date of Patent: Sep. 19, 2017

(54) METHOD AND SYSTEM FOR PROVIDING HEARING ASSISTANCE TO A USER

(71) Applicant: SONOVA AG, Stäfa (CH)

(72) Inventors: Francois Marquis, Corminboeuf (CH); Hans Mulder, Wünnewil (CH); Samuel Harsch, Ballaigues (CH); Tim Jost, Auvernier (CH)

(73) Assignee: Sonova AG, Staefa (CH)

( * ) Notice: Subject to any disclaimer, the term of this patent is extended or adjusted under 35 U.S.C. 154(b) by 81 days.

(21) Appl. No.: 14/783,691

(22) PCT Filed: Apr. 9, 2013

(86) PCT No.: PCT/EP2013/057377
§ 371 (c)(1),
(2) Date: Oct. 9, 2015

(87) PCT Pub. No.: WO2014/166525
PCT Pub. Date: Oct. 16, 2014

(65) Prior Publication Data
US 2016/0057549 A1    Feb. 25, 2016

(51) Int. Cl.
*H04R 25/00* (2006.01)
*H03G 3/34* (2006.01)

(52) U.S. Cl.
CPC ........... *H04R 25/554* (2013.01); *H03G 3/344* (2013.01); *H04R 25/50* (2013.01); *H04R 2225/43* (2013.01)

(58) Field of Classification Search
CPC ...... H04R 3/005; H04R 25/40; H04R 25/407; H04R 25/505; H04R 27/02; H04R 2225/55; H04R 2225/43; H04R 2430/23
See application file for complete search history.

(56) References Cited

U.S. PATENT DOCUMENTS

| 4,696,032 A | 9/1987 | Levy |
| 6,101,376 A | 8/2000 | Bell |

(Continued)

FOREIGN PATENT DOCUMENTS

| EP | 0483701 A2 | 5/1992 | |
| WO | WO2011083181 | * 7/2011 | ............. H04R 25/00 |

OTHER PUBLICATIONS

International Search Report issued in corresponding PCT/EP2013/057377 on Nov. 25, 2013.

*Primary Examiner* — Brian Ensey
(74) *Attorney, Agent, or Firm* — David S. Safran

(57) ABSTRACT

Method for providing hearing assistance to a user by capturing audio signals with a microphone arrangement of a transmission unit; analyzing, by a voice activity detector of the transmission unit, the captured audio signals to judge whether a voice is present close to the microphone arrangement or not, analyzing, by a noise level estimator, the captured audio signals to estimate a surrounding noise level, processing the captured audio signals and transmitting, by a transceiver of the transmission unit, the processed audio signals via a wireless link to a receiver unit, and stimulating the user's hearing, by stimulating means at or in at least one user ear, according to the received audio signals, wherein the audio signals are processed via the wireless link by setting the gain applied to the audio signals according to the close voice/no close voice judgment of the voice activity detector and the estimated surrounding noise level.

45 Claims, 6 Drawing Sheets

(56) References Cited

U.S. PATENT DOCUMENTS

| | | |
|---|---|---|
| 8,019,386 B2 | 9/2011 | Dunn et al. |
| 8,150,057 B2 | 4/2012 | Dunn |
| 8,345,900 B2 | 1/2013 | Marquis et al. |
| 8,831,934 B2 * | 9/2014 | Harsch .................... H04R 3/02 |
| | | 315/291 |
| 9,131,318 B2 | 9/2015 | Mülder et al. |
| 2006/0018229 A1 | 1/2006 | Senba |
| 2010/0195836 A1 | 8/2010 | Platz |
| 2011/0137649 A1 | 6/2011 | Rasmussen |
| 2014/0176297 A1 | 6/2014 | Mülder et al. |

* cited by examiner

METHOD AND SYSTEM FOR PROVIDING HEARING ASSISTANCE TO A USER

BACKGROUND OF THE INVENTION

Field of the Invention

The present invention relates to a method and system for providing hearing assistance to a user, wherein audio signals from a microphone for capturing a speaker's voice are transmitted via a wireless link to a receiver unit, such as an audio receiver for a hearing aid, from where the audio signals are supplied to means worn at ear level for stimulating the hearing of the user, such as a hearing aid loudspeaker.

Description of Related Art

The wireless audio link of hearing assistance systems often is an FM (frequency modulation) radio link operating in the 200 MHz frequency band. In recent systems the analog FM transmission technology is replaced by employing digital modulation techniques for audio signal transmission, most of them working on other frequency bands than the former 200 MHz band.

U.S. Patent Application Publication 2005/0195996 A1 relates to a hearing assistance system comprising a plurality of wireless microphones worn by different speakers and a receiver unit worn at a loop around a listener's neck, with the sound being generated by a headphone connected to the receiver unit, wherein the audio signals are transmitted from the microphones to the receiver unit by using spread spectrum digital signals. The receiver unit controls the transmission of data, and it also controls the pre-amplification gain level applied in each transmission unit by sending respective control signals via the wireless link.

International Patent Application Publication WO 2008/098590 A1 relates to a hearing assistance system comprising a transmission unit having at least two spaced apart microphones, wherein a separate audio signal channel is dedicated to each microphone, and wherein at least one of the two receiver units worn by the user at the two ears is able to receive both channels and to perform audio signal processing at ear level, such as acoustic beam forming, by taking into account both channels.

International Patent Application Publication WO 2010/078435 A1 and corresponding U.S. Pat. No. 8,150,057 relate to a communication system comprising a plurality of transmission units comprising a microphone for capturing the respective speaker's voice and transmitting audio signal data packets to a receiver unit which may be connected to an earphone or to a hearing aid via a plug jack. The transmission units and the receiver unit form a wireless network.

One type of hearing assistance systems is represented by wireless systems, wherein the microphone arrangement is part of a transmission unit for transmitting the audio signals via a wireless audio link to a receiver unit comprising or being connected to the stimulating means. Often in such systems the wireless audio link is an narrow band FM radio link. The benefit of such systems is that sound captured by a remote microphone at the transmission unit can be presented at a much better SNR to user wearing the receiver unit at his ear(s).

According to one typical application of such wireless audio systems, the stimulating means is loudspeaker which is part of the receiver unit or is connected thereto. Such systems are particularly helpful in teaching environments for normal-hearing children suffering from auditory processing disorders (APD), wherein the teacher's voice is captured by the microphone of the transmission unit, and the corresponding audio signals are transmitted to and are reproduced by the receiver unit worn by the child, so that the teacher's voice can be heard by the child at an enhanced level, in particular with respect to the background noise level prevailing in the classroom. It is well known that presentation of the teacher's voice at such enhanced level supports the child in listening to the teacher.

According to another typical application of wireless audio systems the receiver unit is connected to or integrated into a hearing instrument, such as a hearing aid. The benefit of such systems is that the microphone of the hearing instrument can be supplemented or replaced by the remote microphone which produces audio signals which are transmitted wirelessly to the FM receiver and thus to the hearing instrument. In particular, FM systems have been standard equipment for children with hearing loss in educational settings for many years. Their merit lies in the fact that a microphone placed a few inches from the mouth of a person speaking receives speech at a much higher level than one placed several feet away. This increase in speech level corresponds to an increase in signal-to-noise ratio (SNR) due to the direct wireless connection to the listener's amplification system. The resulting improvements of signal level and SNR in the listener's ear are recognized as the primary benefits of FM radio systems, as hearing-impaired individuals are at a significant disadvantage when processing signals with a poor acoustical SNR.

European Patent Application EP 1 691 574 A2 and corresponding U.S. Patent Application Publication 2006/0182295 relate to a wireless system, wherein the transmission unit comprises two spaced-apart microphones, a beam former and a classification unit for controlling the gain applied in the receiver unit to the transmitted audio signals according to the presently prevailing auditory scene. The classification unit generates control commands which are transmitted to the receiver unit via a common link together with the audio signals. The receiver unit may be part of or connected to a hearing instrument. The classification unit comprises a voice energy estimator and a surrounding noise level estimator in order to decide whether there is a voice close to the microphones or not, with the gain to be applied in the receiver unit being set accordingly. The voice energy estimator uses the output signal of the beam former for determining the total energy contained in the voice spectrum.

It is generally known to provide hearing assistance systems with a voice activity detector (VAD) in order to recognize when a speaker's voice is present close to the microphone of the hearing assistance system or not, so that the gain applied to the audio signal is captured by the microphone can be adjusted accordingly; typically, the gain is reduced during times when no close voice is detected in order to avoid unpleasant perception of noise signals.

U.S. Pat. No. 4,696,032 relates to a hearing aid wherein the gain is controlled by the output of a VAD.

U.S. Pat. No. 6,101,376 mentions that FM radio systems may have a manually adjustable squelch, wherein only input signals are passed to the speaker when the input level exceeds an adjustable threshold level.

European Patent Application Publication EP 0 483 701 A2 relates to a hearing aid comprising a soft squelch function, wherein the gain is automatically reduced for low input signal levels.

International Patent Application Publication WO 2010/133703 A2 and corresponding U.S. Pat. No. 9,131,318 relate to hearing assistance system comprising a wireless microphone, wherein the knee-point of the gain curve, i.e. the gain vs. input speech level, is adjusted as a function of the ambient noise level in such a manner that the knee-point is shifted to lower values for low ambient noise levels, i.e. the gain is increased at low ambient noise levels.

International Patent Application Publication WO 2008/138365 A1 and corresponding U.S. Pat. No. 8,345,900 relate to a FM wireless microphone hearing assistance system particularly suited for school applications and comprising a VAD and a surrounding noise level estimation unit in the audio signal transmission unit, wherein in addition to the audio signals control data is sent to the ear level receiver unit so that a gain control unit of the receiver unit selects the gain according to whether the transmission unit is in the "voice on" regime or in the "voice off" regime. In the "voice off" regime the gain is reduced by a fixed attenuation factor (such as 20 dB) compared to the "voice on" regime. An additional gain off-set depending on the estimated surrounding noise level is applied in both regimes, with the gain off-set being the same in both regimes. Thus, the gain is always reduced by e.g. 20 dB—irrespective of the surrounding noise level— when the VAD detects that the speaker stops talking. A similar system is described in European Patent Application Publication EP 1 863 320 A1.

European Patent Application Publication WO 2010/000878 A2 and corresponding U.S. Pat. No. 8,831,934 relate to a speech enhancement system comprising a wireless microphone for a loudspeaker arrangement placed in a room, wherein the gain is selected as a function of the ambient noise level in order to implement a "surrounding noise compensation" (SNC). The system comprises a VAD and an ambient noise estimator for determining the surrounding noise level during times when the VAD signal indicates that the speaker is not speaking. During times, when the VAD signal indicates that the speaker is speaking, the gain is increased, until the ambient noise level is expected to be masked by the late reverberation level.

SUMMARY OF THE INVENTION

It is an object of the invention to provide for a hearing assistance method and system comprising a microphone arrangement connected via a wireless audio link to an ear level receiver unit, wherein the perception of unwanted noise should be minimized while intelligibility of speech should be optimized also during times when the speaker utilizing the microphone arrangement begins to speak.

According to the invention, this object is achieved by a method and a system as described herein.

The invention is beneficial in that, by selecting the attenuation value, by which the gain is reduced when a change from close voice to no close voice is judged, is selected as a function of the estimated surrounding noise level in such a manner that the attenuation value increases with increasing estimated surrounding noise level, the attenuation in the "voice off" regime can be kept as small as possible, and, in particular, it can be kept very low at low surrounding noise levels, so that the intelligibility of the first part of a word spoken after a long speech pause is significantly improved even in case that the VAD does not react fast enough to ramp up the gain to the "voice on" value.

The reason is that the relatively low attenuation at least at low surrounding noise level enables speech intelligibility even at the "voice off" gain level. A particularly strong attenuation reduction (corresponding to an increase in "voice off" gain) at low surrounding noise levels is possibly when the audio link is digitally modulated, since a digitally modulated link has no distance dependent channel noise—as opposed to the case of an analog FM link (in other words, the channel noise in a digitally modulated link is less critical than in an analog FM link); thus, the invention is particularly suitable for digitally modulated audio links.

A reduced "voice off" gain attenuation is beneficial, since voice activity detection in practice is sometimes critical, especially, if the speech level is low, if the microphone arrangement is not placed correctly or if there are noisy conditions.

Preferably, the attenuation value is set to a minimum attenuation value when the estimated surrounding noise level is at or below a first threshold value; preferably, the minimum attenuation value is not more than 6 dB (for example, for surrounding noise levels below 58 dBA). The attenuation value may be set to a maximum attenuation value when the estimated surrounding noise level is above or at a second threshold value. Preferably, the attenuation value is selected to increase linearly with a first slope within a range of the estimated surrounding noise level defined by the first and second threshold values with increasing estimated surrounding noise level.

Typically, the first gain value is selected to increase with increasing estimated surrounding noise level in order to provide for a surrounding noise compensation (SNC). The first gain value may be selected to increase linearly with the second slope within a second range of the estimated surrounding noise level with increasing estimated surrounding noise level, with the first gain value being constant at a minimum value and at a maximum value, respectively, outside that range. Typically, the first slope, i.e. the increase of the attenuation value, is smaller than the second slope, i.e. the increase of the first gain value (in the "voice on" regime).

The gain control may be implemented in the transmission unit, in the receiver unit, in a hearing instrument connected to the receiver unit, or in both the transmission unit and the receiver unit (or a hearing instrument connected to the receiver unit, respectively); in the latter case, the first gain value may be applied in the receiver unit and the attenuation value may be applied in the transmission unit.

Further preferred embodiments are described herein.

Hereinafter, examples of the invention will be illustrated by reference to the accompanying drawings.

DETAILED DESCRIPTION OF THE INVENTION

Figure 1:
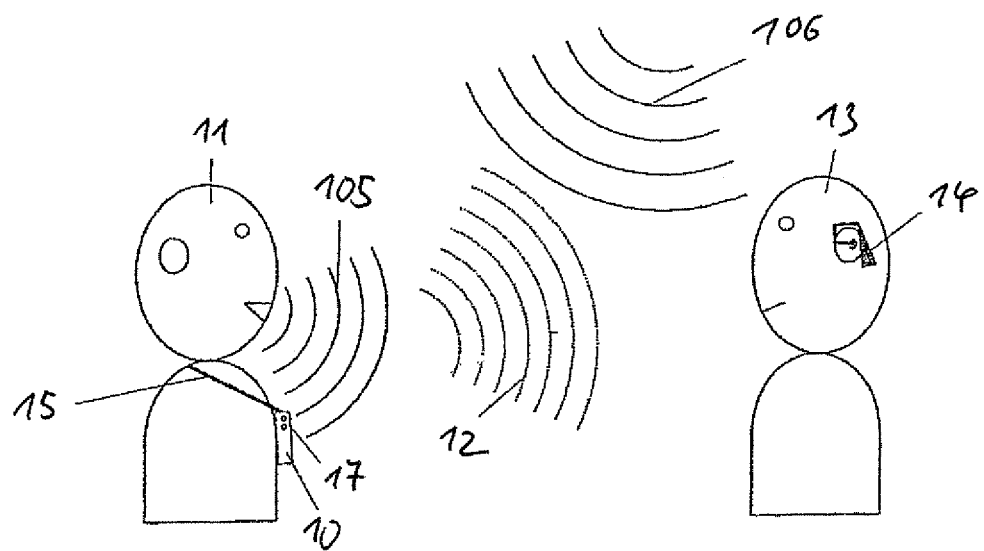
FIG. 1 is a schematic view of the use of a first embodiment of a hearing assistance system according to the invention.
Figure 5:
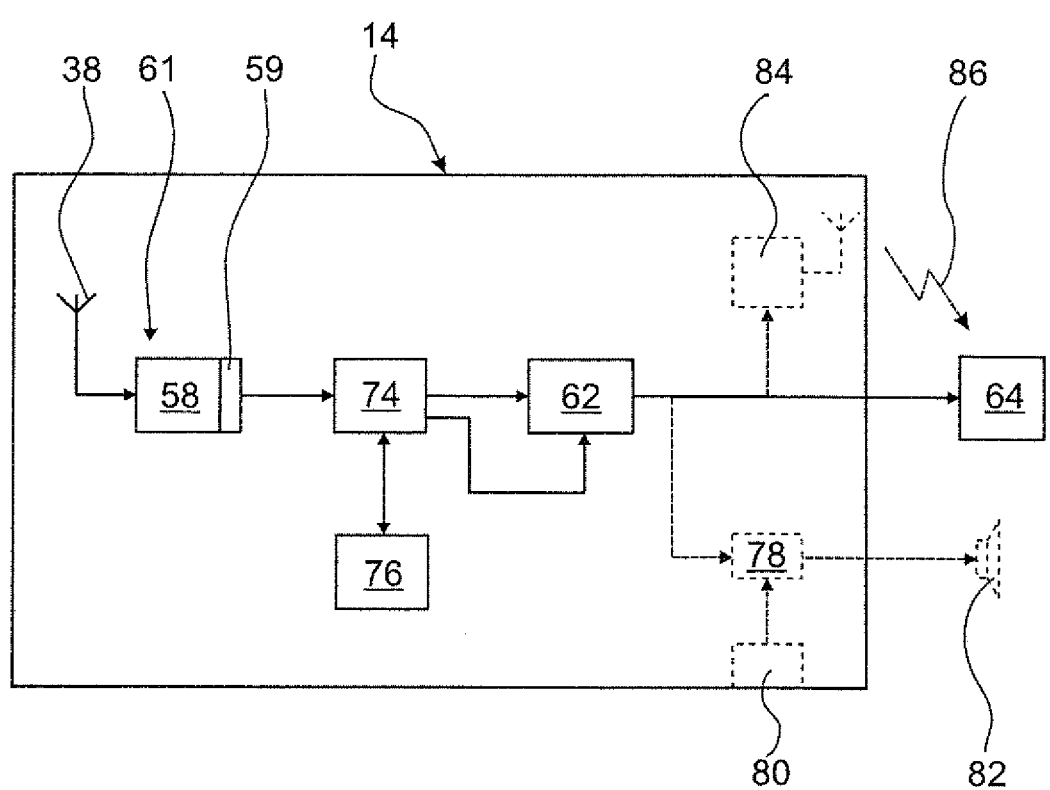
FIG. 5 is a block diagram of an example of a receiver unit to be used with the invention.

FIG. 1 shows schematically the use of a system for hearing assistance comprising a DM radio transmission unit 10 comprising a directional microphone arrangement 17 consisting of two omnidirectional microphones 17A and 17B which are spaced apart by a distance d, and a DM radio receiver unit 14 comprising a loudspeaker 82 (shown only in FIG. 5). While the microphone arrangement preferably consists of at least two spaced apart microphones, it could generally also consist of more than two microphones. The transmission unit 10 is worn by a speaker 11 around his neck by a neck-loop 15, with the microphone arrangement 17 capturing the sound waves 105 carrying the speaker's voice. Audio signals and control data are sent from the transmission unit 10 via radio link 12 to the receiver unit 14 worn by a user/listener 13. In addition to the voice 105 of the speaker 11 background/surrounding noise 106 may be present which will be both captured by the microphone arrangement 17 of the transmission unit 10 and the ears of the user 13. Typically the speaker 11 will be a teacher and the user 13 will be a normal-hearing child suffering from APD, with background noise 106 being generated by other pupils.

Figure 2:
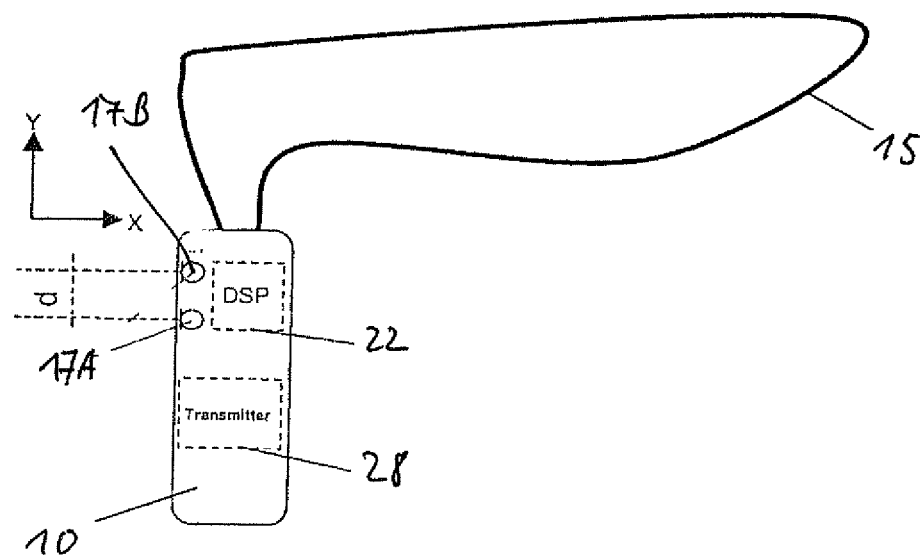
FIG. 2 is a schematic view of the transmission unit of the system of FIG. 1.

FIG. 2 is a schematic view of the transmission unit 10 which, in addition to the microphone arrangement 17, comprises a digital signal processor 22 and a DM transmitter 28.

According to one embodiment, the transmission unit 10 may be adapted to be worn by the respective speaker 11 below the speaker's neck, for example with a transmitter using a lapel microphone or a shirt collar microphone.

Figure 3:
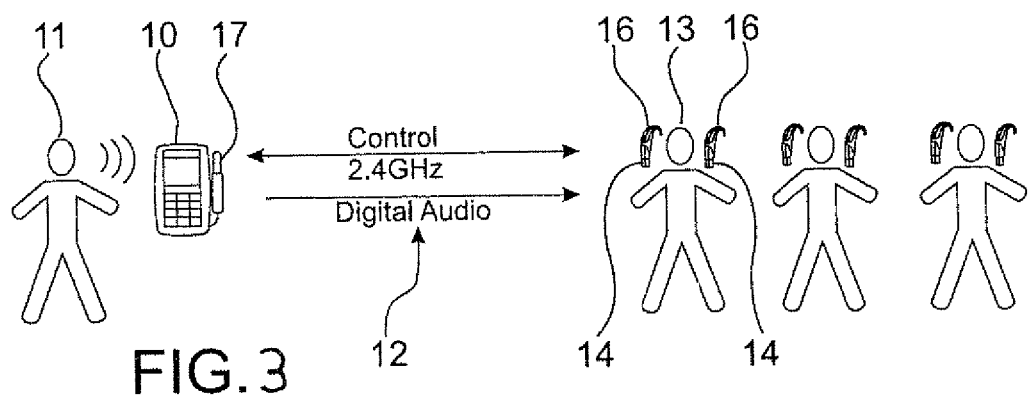
FIG. 3 is a view like FIG. 1, wherein an alternative embodiment is shown.

In FIG. 3 another typical use case is shown schematically, wherein a body-worn transmission unit 10 comprising a microphone arrangement 17 is used by a teacher 11 in a classroom for transmitting audio signals corresponding to the teacher's voice via a digital link 12 to a plurality of receiver units 14, which are integrated within or connected to hearing aids 16 worn by hearing-impaired pupils/students 13. The digital link 12 is also used to exchange control data between the transmission unit 10 and the receiver units 14. Typically, the transmission unit 10 is used in a broadcast mode, i.e. the same signals are sent to all receiver units 14.

Figure 4:
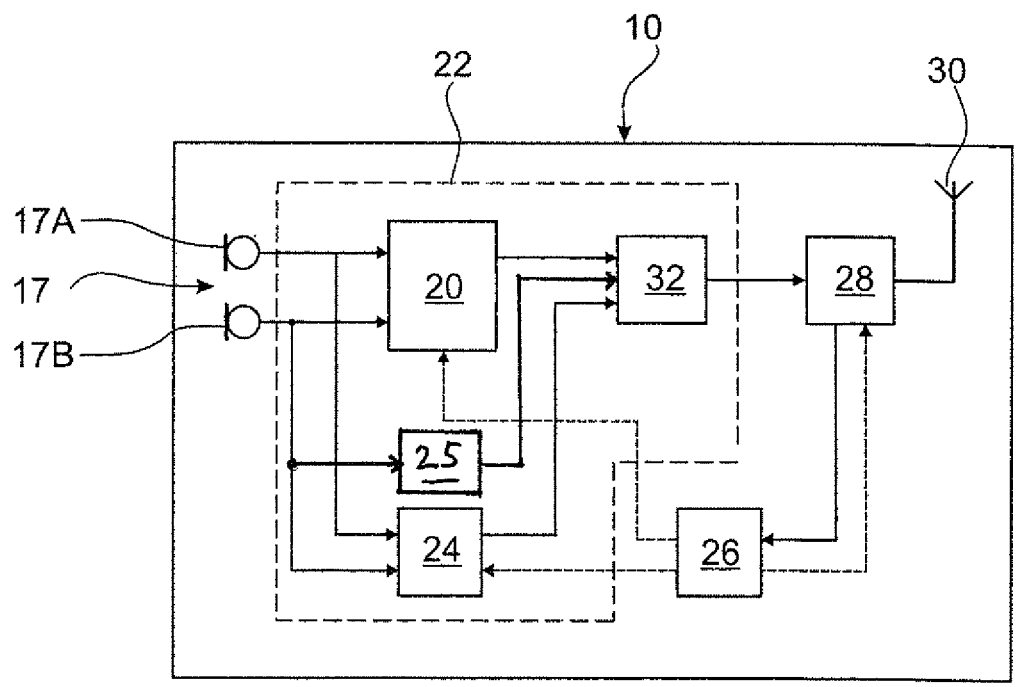
FIG. 4 is a block diagram of an example of a transmission unit to be used with the invention.

An example of a transmission unit 10 is shown in FIG. 4, which comprises a microphone arrangement 17 for capturing audio signals from the respective speaker's 11 voice, an audio signal processing unit 20 for processing the captured audio signals, a digital transmitter 28 and an antenna 30 for transmitting the processed audio signals as an audio stream consisting of audio data packets. The audio signal processing unit 20 serves e.g. to compress the audio data using an appropriate audio codec and to provide for acoustic beamforming. The compressed audio stream forms part of a digital audio link 12 established between the transmission units 10 and the receiver unit 14, which link also serves to exchange control data packets between the transmission unit 10 and the receiver unit 14.

The transmission units 10 further includes a voice activity detector (VAD) 24 and a surrounding noise level (SNL) estimator 25. The audio signal processing unit 20, the VAD 24 and the SNL estimator 25 may be implemented by a digital signal processor (DSP) indicated at 22.

In addition, the transmission units 10 also may comprise a microcontroller 26 acting on the DSP 22 and the transmitter 28. The microcontroller 26 may be omitted in case that the DSP 22 is able to take over the function of the microcontroller 26.

The microphone arrangement 17 comprises at least two spaced-apart microphones 17A, 17B, the audio signals of which may be used in the audio signal processing unit 20 for acoustic beamforming in order to provide the microphone arrangement 17 with a directional characteristic.

The VAD 24 uses the audio signals from the microphone arrangement 17 as an input in order to determine the times when the person 11 using the respective transmission unit 10 is speaking.

The VAD 24 may provide a corresponding control output signal to the microcontroller 26 in order to have, for example, the transmitter 28 sleep during times when no voice is detected and to wake up the transmitter 28 during times when voice activity is detected. In addition, a control command corresponding to the output signal of the VAD 24 may be generated and transmitted via the wireless link 12 in order to mute the receiver units 14 or saving power when the user 11 of the transmission unit 10 does not speak. To this end, a unit 32 is provided which serves to generate a digital signal comprising the audio signals from the processing unit 20 and the control data generated by the VAD 24, which digital signal is supplied to the transmitter 28.

The VAD 24 comprises a voice energy estimator unit which uses the microphone signals (or a processed version of the microphone signals) in order to compute the total energy contained in the voice spectrum with a fast attack time in the range of a few milliseconds, preferably not more than 10 milliseconds. By using such short attack time it is ensured that the system is able to react very fast when the speaker 12 begins to speak.

The VAD 24 also comprises a direction of arrival (DOA) estimator which is provided for estimating, by comparing the audio signals captured by the microphone 17A and the audio signals captured by the microphone 17B, the DOA value of the captured audio signals. The DOA value indicates the Direction of Arrival estimated with the phase differences in the audio band of the incoming signal captured by the microphones 17A, 17B.

The VAD 24 decides, depending on the signals provided by the voice energy estimator and the DOA estimator, whether close voice, i.e. the speaker's voice, is present at the microphone arrangement 17 or not. Such type of VAD is described in more detail in WO 2009/138365 A1 and corresponding U.S. Pat. No. 8,345,900.

The SNL estimator 25 serves to estimate the ambient noise level and generates a corresponding output signal which may be supplied to the unit 32 for being transmitted via the wireless link 12.

More in detail, the SNL estimator 25 uses the audio signal produced by the omnidirectional rear microphone 17B in order to estimate the surrounding noise level present at the microphone arrangement 17. However, it can be assumed that the surrounding noise level estimated at the microphone arrangement 17 is a good indication also for the surrounding noise level present at the ears of the user 13, like in classrooms for example. The SNL estimator 25 may be active only if no close voice is presently detected by the VAD 24 (in case that close voice is detected by the VAD 24, the SNL estimator 25 is disabled by a corresponding signal from the VAD 24). A very long time constant in the range of 10 seconds may be applied by the SNL estimator 25. The SNL estimator 25 measures and analyzes the total energy contained in the whole spectrum of the audio signal of the microphone 17B (usually the surrounding noise in a classroom is caused by the voices of other pupils in the classroom). The long time constant ensures that only the time-averaged surrounding noise is measured and analyzed, but not specific short noise events.

The surrounding noise level values may be updated regularly during speech pauses, e.g. with a rate in the range of 20 ms to 5 s.

The A-weighted output of the SNL estimator 25 may be also supplied to the VAD in order to be used to adapt accordingly to it the threshold level for the close voice/no close voice decision made by the VAD 24 in order to maintain a good SNR for the voice detection.

An example of a digital receiver unit 14 is shown in FIG. 5, according to which an antenna arrangement 38 is connected to a digital transceiver 61 including a demodulator 58 and a buffer 59. The signals transmitted via the digital link 12 are received by the antenna 38 and are demodulated in the digital radio receiver 61. The demodulated signals are supplied via the buffer 59 to a DSP 74 acting as processing unit which separates the signals into the audio signals and the control data and which is provided for advanced processing, e.g. equalization, of the audio signals according to the information provided by the control data. The receiver unit 14 also includes a memory 76 for the DSP 74. The processed audio signals, after digital-to-analog conversion, are supplied to a variable gain amplifier 62 which serves to amplify the audio signals by applying a gain controlled by the control data received via the digital link 12. The gain may be applied in the DSP 74, in the variable gain amplifier 62 or in both.

The amplified audio signals may be supplied to the audio input of a hearing aid 64.

Rather than supplying the audio signals amplified by the variable gain amplifier 62 to the audio input of a hearing aid 64, the receiver unit 14 may include a power amplifier 78 which may be controlled by a manual volume control 80 and which supplies power amplified audio signals to a loudspeaker 82 which may be an ear-worn element integrated within or connected to the receiver unit 14. Volume control also could be done remotely from the transmission unit 10 by transmitting corresponding control commands to the receiver unit 14.

Another alternative implementation of the receiver maybe a neck-worn device having a transmitter 84 for transmitting the received signals via with an magnetic induction link 86 (analog or digital) to the hearing aid 64 (as indicated by dotted lines in FIG. 5).

As already explained above, the VAD 24 provides at its output for a parameter signal which may have two different values:
(a) "Voice ON": This value is provided at the output if the VAD 24 has decided that close voice is present at the microphone arrangement 17. In this case, a control command is issued and is transmitted to the receiver unit 14, according to which the gain is set to a given value for the amplifier 62 and/or the DSP 74.
(b) "Voice OFF": If the VAD 24 decides that no close voice is present at the microphone arrangement 17, a "voice OFF" command is issued and is transmitted to the receiver unit 14. In this case, the DSP 74 applies a "hold on time" constant and then a "release time" constant to the amplifier 62. During the "hold on time" the gain set by the amplifier 62 remains at the value applied during "voice ON". During the "release time" the gain set by the amplifier 62 is progressively reduced from the value applied during "voice ON" to a lower value corresponding to a "pause attenuation" value. Hence, in case of "voice OFF" the gain of the microphone arrangement 17 is reduced relative to the gain of the microphone arrangement 17 during "voice ON". This ensures an optimum SNR of the sound signals present at the user's ear, since at that time no useful audio signal is present at the microphone arrangement 17 of the transmission unit 10, so that user 13 may perceive ambient sound signals (for example voice from his neighbor in the classroom) without disturbance by noise of the microphone arrangement 17.

In general, the gain is set to a first gain value $g_1$ during times when the presence of close voice is judged by the VAD 24, and the gain is reduced from this first gain value by an attenuation value a to a second gain value $g_2$ when a change from close voice (voice on) to no close voice (voice off) is judged by the VAD 24. Unlike in the prior art approaches, the attenuation value a is not constant but is selected as a function of the estimated surrounding noise level (i.e. the output signal of the SNL estimator 25) in such a manner that the attenuation value increases with increasing estimated SNL.

On the other hand, the gain is increased from the second gain value $g_2$ by the attenuation value a to the first gain value $g_1$ when a change from no close voice (voice off) to close voice (voice on) is judged by the VAD 24.

Typically, the first gain value $g_1$ is set as a function of the estimated SNL.

Figure 7:
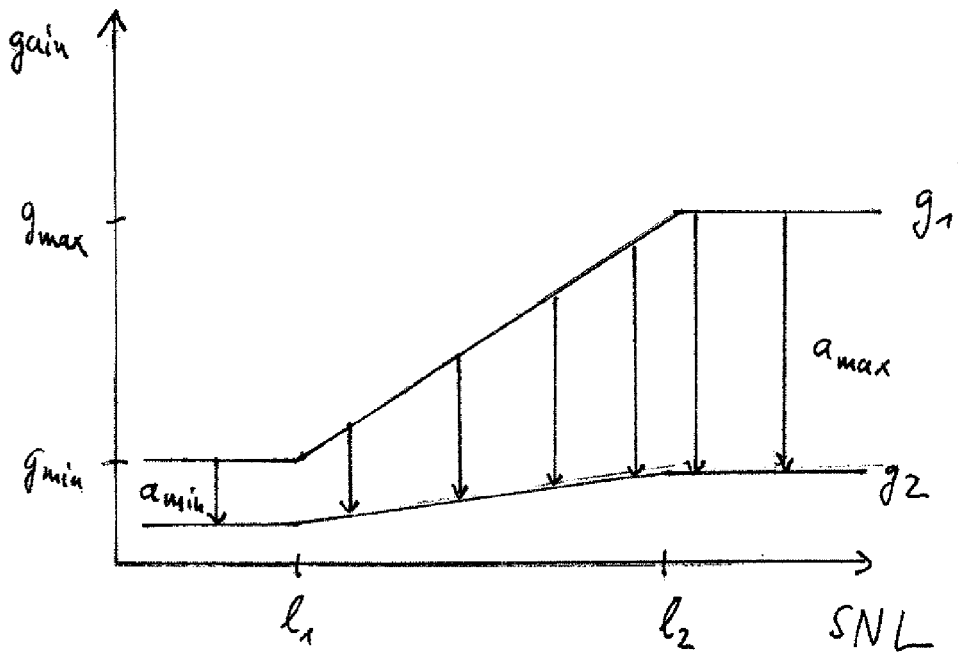
FIG. 7 is a diagram showing the first gain value, the attenuation value and the second gain value, respectively, as a function of the surrounding noise level.
Figure 6:
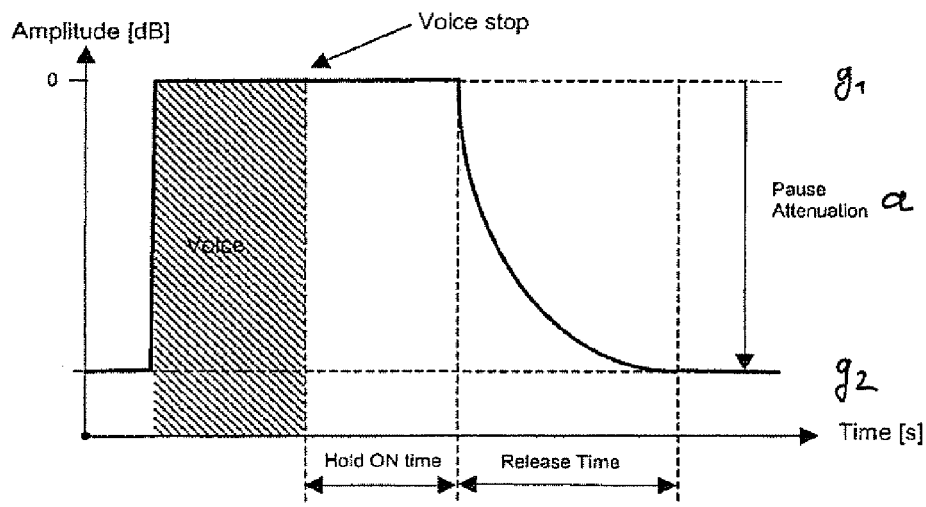
FIG. 6 is a diagram showing an example of the gain set by the gain control unit vs. time when the speaker stops speaking.

An example of the dependence of the first gain value $g_1$, the second gain value $g_2$ and the attenuation value a on the SNL is shown in FIG. 7. The first gain value $g_1$ is selected to increase with increasing estimated SNL. According to the example of FIG. 7, the first gain value $g_1$ increases linearly within a range defined by a lower limit $l_1$ and an upper limit $l_2$ of the SNL while it has a lower constant value $g_{min}$ for SNL values below $l_1$ and an upper constant value $g_{max}$ when the SNL is at or above the upper limit $l_2$. The reason for selecting the first gain value in such a manner is to provide for a surrounding noise compensation in order to provide for a good signal to noise ratio of the captured audio signals. For example, the lower limit $l_1$ of the linear range may correspond to a noise level of 56 dBA and the upper limit $l_2$ of the linear range may correspond to a noise level of 76 dBA.

The attenuation value a may be set to a minimum value $a_{min}$ when the estimated SNL is at or below a first threshold value (which typically corresponds to the lower limit $l_1$ of the linear range of the first gain value $g_1$), and it may be set to a maximum attenuation value $a_{min}$ when the estimated SNL is at or above a second threshold value (which typically corresponds to the upper limit $l_2$ of the linear range of the second gain value $g_2$). The minimum attenuation value $a_{min}$ may be, for example, 6 dB, and the maximum attenuation value $a_{max}$ may be, for example, 21 dB.

Typically, the attenuation value a is selected to increase linearly within the range between the minimum value $a_{min}$ and the maximum value $a_{max}$, with that range of the SNL being the same as that for the linear increase of the first gain value $g_1$. Typically, the slope of the linear increase of the first gain value $g_1$ is steeper than the slope of the linear increase of the attenuation value a. In FIG. 7 an example is shown, wherein the slope of the attenuation value is only 75% of the slope of the first gain value, so that, as a consequence, the second gain value $g_2$ (i.e. the gain applied in the "voice off" regime) increases slightly with increasing SNL within the SNL range from $l_1$ to $l_2$.

While in the embodiment shown in FIGS. 4 and 5 the noise level estimator 25 is shown as part of the transmission unit 10, the noise level estimator rather may be implemented as part of the receiver unit 14. In this case, the audio signals received by the receiver unit 14 from the transmission unit 10 may be used as input to the noise level estimator.

Alternatively, the receiver unit 14 may be provided with a microphone for capturing audio signals which may be used as input to the noise level estimator, or audio signals captured by the microphone of a hearing aid to which the receiver unit 14 is connected or into which the receiver unit is integrated may be used as input to the noise level estimator.

Figure 10:
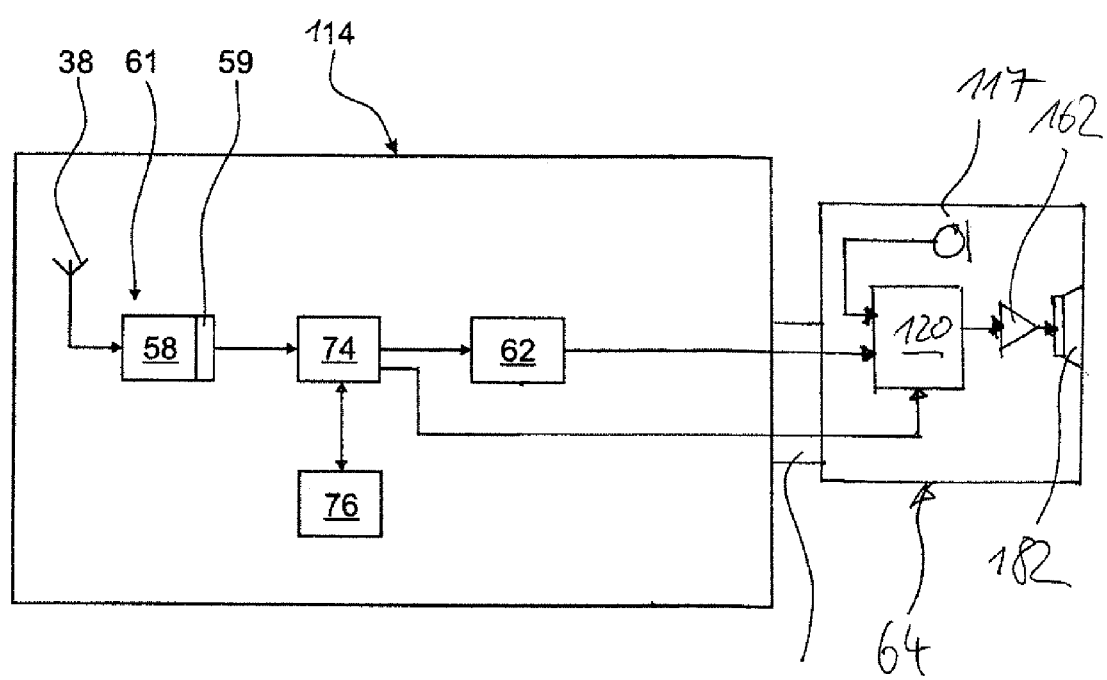
FIG. 10 is a block diagram of a second alternative example of a receiver unit to be used with the invention.

A modification of the example of the receiver unit of FIG. 5 is shown FIG. 10, wherein the gain control of the wirelessly received audio signals is not implemented in the receiver unit 114 itself but rather in a hearing instrument 64 connected to the receiver unit 114 via an interface 66. In this case, the amplifier 62 of the receiver unit applies a constant gain to the received audio signals, with the amplified audio signals being supplied via the interface 66 as input to an audio signal processing unit 120 of the hearing instrument 64; further audio signal input to the audio signal processing unit 120 is supplied by a microphone arrangement 117 of the hearing instrument 64. The gain control data (and optionally other control data) received by the receiver unit 114 and extracted by the DSP 74 are supplied via the interface 66 to the audio signal processing unit 120 of the hearing instrument 64 in order to adjust the total gain applied to the audio signals transmitted to the receiver unit 114 accordingly. The audio signal output of the audio signal processing unit 120 is amplified at 162 and is supplied to the hearing instrument speaker 182.

Figure 8:
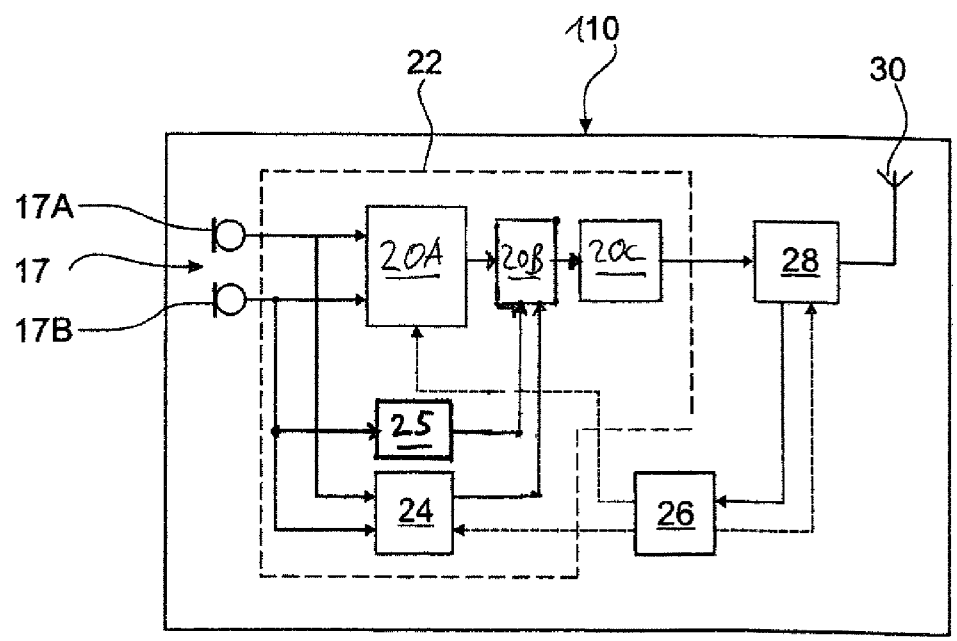
FIG. 8 is a block diagram of an alternative example of a transmission unit to be used with the invention.

A modification of the example of the transmission unit of FIG. 4 is shown FIG. 8, wherein the gain control is not implemented in the receiver unit 14 but rather in the transmission unit 110. To this end, the transmission unit is provided with a gain control unit 20B which serves to apply a gain controlled by the output of the SNL estimator 25 and the VAD 24 to the audio signal captured by the microphone arrangement 17. The captured audio signals already may have undergone some processing prior to being treated by the gain control unit; in the example of FIG. 8, the gain control unit 20B acts on the audio signal output of an acoustic beamformer unit 20A.

In the example of FIG. 8, the gain controlled audio signals are supplied to a unit 20C which serves to compress the audio signal, i.e. the audio data, using an appropriate audio codec. The compressed audio signal/data then is supplied to the digital transmitter for transmission via the audio link 12.

In the example of FIG. 8, the units 20A and 20C serve to provide for the functionality of the audio signal processing unit 20 of the example of FIG. 4. Since in the example of FIG. 8 it is not necessary to transmit audio control data provided by the SNL estimator 25 and the VAD 24 to the receiver unit, the data mixing unit 32 of the example of FIG. 4 may be omitted.

Figure 9:
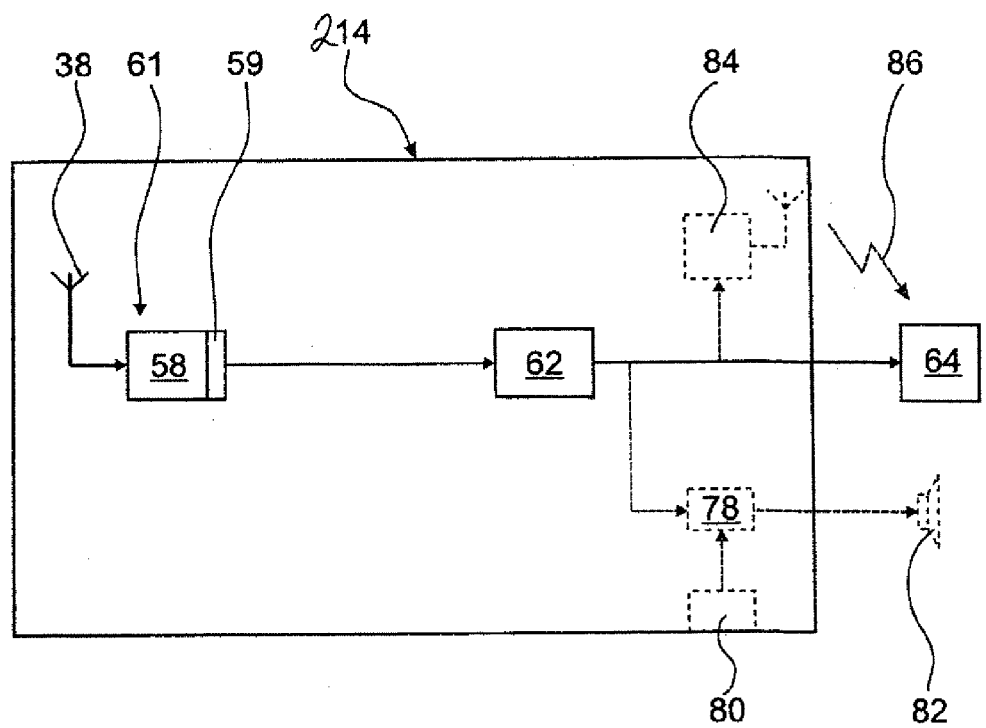
FIG. 9 is a block diagram of a first alternative example of a receiver unit to be used with the invention.

In FIG. 9, an example of a receiver unit 214 is shown, which is a modification of the example of FIG. 5 suitable for use with a transmission unit capable of performing the gain control otherwise implemented in the receiver unit, such as the transmission unit of FIG. 8. Since the receiver unit 214 is not configured for performing gain control, the units 74 and 76 of the receiver unit 14 of FIG. 5 may be omitted.

What is claimed is:

1. A method for providing hearing assistance to a user, comprising:
    capturing audio signals by a microphone arrangement (17) of a transmission unit (10, 110);
    analyzing, with a voice activity detector (24) of the transmission unit, the captured audio signals in order to judge whether a voice is present close to the microphone arrangement or not;
    analyzing, by a noise level estimator (25), the captured audio signals in order to estimate a surrounding noise level;
    processing the captured audio signals and transmitting, with a transceiver (28) of the transmission unit, the processed audio signals via a wireless link (12) to a receiver unit (14, 114, 214); and
    stimulating the user's hearing with stimulating means (16, 64, 82, 182) worn at or in at least one of the user's ears in accordance with the transmitted processed audio signals received by the receiver unit;
    wherein the audio signals are processed prior to and/or after transmission via the wireless link by applying a gain to the audio signals according to close voice/not close voice judgment of the voice activity detector and the surrounding noise level estimated,
    wherein said gain is set to a first gain value ($g_1$) during times when the presence of close voice is judged, wherein said gain is reduced from the first gain value by an attenuation value (a) to a second gain value ($g_2$) when a change from close voice to not close voice is judged, and
    wherein the attenuation value is selected as a function of the surrounding noise level estimated in such a manner that the attenuation value increases as the surrounding noise level estimated increases.

2. The method of claim 1, wherein the audio signals received by the receiver unit (14, 114) are processed, by a gain control unit (62, 74, 120), by applying said gain to the received audio signals.

3. The method of claim 1, wherein the captured audio signals are processed, prior to transmission, by a gain control unit (20B) of the transmission unit (110), by applying said gain to the captured audio signals.

4. The method of claim 1, wherein said gain is increased from the second gain value ($g_2$) by the attenuation value (a) to the first gain value ($g_1$) when a change from no close voice to close voice is judged.

5. The method of claim 2, wherein the voice activity detector (24) generates a close voice judgement value, and wherein the noise level estimator (25) generates a surrounding noise level estimation value.

6. The method of claim 5, wherein the attenuation value (a) is determined in the transmission unit (10) from the close voice judgement value and the surrounding noise level estimation value, and wherein the attenuation value or a corresponding command for the gain control unit (62, 74, 120) is transmitted to the receiver unit (14, 114).

7. The method of claim 5, wherein the noise level estimator (25) is part of the transmission unit (10), and wherein audio signals captured by the microphone arrangement (17) are supplied as input to the noise level estimator.

8. The method of claim 7, wherein the close voice judgement value and the surrounding noise level estimation value are transmitted via the digital wireless link (12) to the receiver unit (14, 114) for selecting the attenuation value (a).

9. The method of claim 1, wherein the attenuation value (a) is set to a minimum attenuation value ($a_{min}$) when the estimated surrounding noise level is at or below a first threshold value ($l_1$).

10. The method of claim 9, wherein the first threshold value ($l_1$) is not more than 66 dBA.

11. The method claim 9, wherein the attenuation value (a) is set to a maximum attenuation value ($a_{max}$) when the estimated surrounding noise level is above or at a second threshold value ($l_2$).

12. The method of claim 11, wherein the maximum attenuation value ($a_{max}$) is at least 10 dB.

13. The method of claim 11, wherein the second threshold value ($l_2$) is at least 70 dBA.

14. The method of claim 11, wherein the attenuation value (a) is selected to increase linearly with a first slope within a first range of the estimated surrounding noise level with increasing estimated surrounding noise level.

15. The method of claim 14, wherein the attenuation value (a) is set to a minimum attenuation value ($a_{min}$) when the estimated surrounding noise level is at or below a first threshold value ($l_1$), wherein the first range is limited by the first threshold value ($l_1$) and the second threshold value ($l_2$), respectively.

16. The method of claim 9, wherein the minimum attenuation value ($a_{min}$) is not more than 6 dB.

17. The method of claim 1, wherein the first gain value ($g_1$) is set as a function of the estimated surrounding noise level.

18. The method of claim 17, wherein the first gain value ($g_1$) is selected to increase with increasing estimated surrounding noise level.

19. The method of claim 18, wherein the first gain value ($g_1$) is selected to increase linearly with a second slope within a second range of the estimated surrounding noise level with increasing estimated surrounding noise level.

20. The method of claim 14, wherein the first gain value ($g_1$) is selected to increase linearly with a second slope within a second range of the estimated surrounding noise level with increasing estimated surrounding noise level, wherein the first gain value ($g_1$) has a lower constant value ($g_{min}$) when the estimated surrounding noise level is below or at the lower limit of said second range and has an upper constant value ($g_{max}$) when the estimated surrounding noise level is above or at the upper limit ($l_2$) of said second range.

21. The method of claim 19, wherein the first slope is smaller than the second slope.

22. The method of claim 13, wherein the first gain value ($g_1$) is selected to increase with increasing estimated surrounding noise level, and wherein the first range and the second range are identical.

23. The method of claim 16, wherein during times when no presence of close speech is judged the second gain value ($g_3$) is adjusted, upon a change in the estimated surrounding noise level, to the new estimated surrounding noise level according to a function which varies less strongly with the estimated surrounding noise level than the function of the first gain value ($g_1$) and the function of the attenuation value (a).

24. The method of claim 1, wherein the surrounding noise level estimation is performed only if it has been judged that there is no close voice captured by the microphone arrangement (17).

25. The method of claim 1, wherein the gain control unit (20B, 62, 74, 120) reduces the gain progressively from the first value ($g_1$) to the second value (g2) during a given release time period when a change from close voice to no close voice is judged.

26. The method of claim 15, wherein the release time period is from 100 ms to 10 seconds.

27. The method of claim 1, wherein the gain control unit (20B, 62, 74, 120) keeps the gain at the first gain value ($g_1$) for a given hold-on time period when a change from close voice to no close voice is judged, prior to progressively reducing the gain from the first gain value to the second gain value ($g_2$) during a release time period.

28. The method of claim 17, wherein the hold-on time period is from 100 ms to 10 seconds.

29. The method of claim 1, wherein the gain control unit (20B, 62, 74) increases the gain within an attack time period from the second gain value ($g_2$) to the first gain value ($g_1$) when a change from no close voice to close voice is judged.

30. The method of claim 29, wherein the attack time period is from 0.5 ms to 10 ms.

31. The method of claim 1, wherein the microphone arrangement (17) comprises at least two spaced apart microphones (17A, 17B), wherein for judging whether a voice is present close to the microphone arrangement, the total energy contained in the voice spectrum of the audio signals captured at at least one of the microphones is estimated, and wherein the value of the direction of arrival of the captured audio signals is estimated by comparing the audio signals captured by at least two of the spaced apart microphones.

32. The method of claim 1, wherein the transceiver (28) is a digital transceiver and wherein the wireless link (12) is a digitally modulated link.

33. The method of claim 1, wherein said first gain value is applied in the receiver unit and said attenuation value is applied in the transmission unit.

34. A system for providing hearing assistance to a user, comprising:
   a receiver unit (14, 114):
   a transmission unit (10) comprising
   a microphone arrangement (17) for capturing audio signals,
   a voice activity detector (24) for analyzing the captured audio signals in order to judge whether a voice is present close to the microphone arrangement,
   an audio signal processing unit (20) for processing the captured audio signals,
   a transceiver (28) for transmitting the processed audio signals via a wireless link (12) to the receiver unit;
   the system comprising a noise level estimator (25) for analyzing captured audio signals in order to estimate a surrounding noise level,
   the system further comprising
   a gain control unit (62, 74, 120), and
   means (62, 74) for processing the received audio signals by setting, by said gain control unit, the gain applied to the audio signals according to the close voice judgment and the estimated surrounding noise level; and
   means (16, 64, 82, 120) to be worn at or in at least one of the user's ears for stimulating the user's hearing according to the audio signals processed by said means for processing the received audio signals;
   wherein said gain is set to a first gain value ($g_1$) as a function of the surrounding noise level estimation during times when the presence of close voice is judged, wherein said gain is reduced from the first gain value by an attenuation value (a) to a second gain value ($g_2$) when a change from close voice to no close voice is judged, and wherein the attenuation value is selected as a function of the estimated surrounding noise level in such a manner that the attenuation value increases with increasing estimated surrounding noise level.

35. The system of one of claim 34, wherein the stimulating means (82) is part of the receiver unit (14, 214) or is directly connected thereto.

36. The system of one of claim 34, wherein the receiver unit (14, 114, 214) is part of or connected to a hearing instrument (16, 64) comprising the stimulating means (182).

37. The system of claim 36, wherein the gain control unit (120) forms part of the hearing instrument (64).

38. The system of claim 36, wherein the gain control unit (62) forms part of the receiver unit (14).

39. The system of claim 34, wherein the noise level estimator (25) is part of the transmission unit (10, 110).

40. A system for providing hearing assistance to a user, comprising:
- a receiver unit (214);
- a transmission unit (110) comprising
  - a microphone arrangement (17) for capturing audio signals,
  - a voice activity detector (24) for analyzing the captured audio signals in order to judge whether a voice is present close to the microphone arrangement,
  - an audio signal processing unit (20) for processing the captured audio signals, the audio signal processing unit including a gain control unit (20B)
  - a transceiver (28) for transmitting the processed audio signals via a wireless link (12) to the receiver unit;
- the system comprising a noise level estimator (25) for analyzing captured audio signals in order to estimate a surrounding noise level,
- means (16, 64, 82) to be worn at or in at least one of the user's ears for stimulating the user's hearing according to the audio signals received by said receiver unit;

wherein said gain control unit is adapted set the gain applied to the captured audio signal to a first gain value ($g_1$) as a function of the surrounding noise level estimation during times when the presence of close voice is judged, wherein said gain is reduced from the first gain value by an attenuation value (a) to a second gain value ($g_2$) when a change from close voice to no close voice is judged, and wherein the attenuation value is selected as a function of the estimated surrounding noise level in such a manner that the attenuation value increases with increasing estimated surrounding noise level.

41. The system of one of claim 40, wherein the stimulating means (82) is part of the receiver unit (14, 214) or is directly connected thereto.

42. The system of one of claim 40, wherein the receiver unit (14, 114, 214) is part of or connected to a hearing instrument (16, 64) comprising the stimulating means (182).

43. The system of claim 42, wherein the gain control unit (120) forms part of the hearing instrument (64).

44. The system of claim 42, wherein the gain control unit (62) forms part of the receiver unit (14).

45. The system of claim 40, wherein the noise level estimator (25) is part of the transmission unit (10, 110).

* * * * *